United States Patent [19]

Dennison

[11] Patent Number: 5,726,483
[45] Date of Patent: Mar. 10, 1998

[54] METHOD OF JOINTLY FORMING STACKED CAPACITORS AND ANTIFUSES, METHOD OF BLOWING ANTIFUSES, AND ANTIFUSES AND STACKED CAPACITORS CONSTITUTING A PART OF INTEGRATED CIRCUITRY

[75] Inventor: Charles H. Dennison, Boise, Id.

[73] Assignee: Micron Technology, Inc., Boise, Id.

[21] Appl. No.: 503,022

[22] Filed: Jul. 17, 1995

[51] Int. Cl.$^6$ .................................................. H01L 29/00
[52] U.S. Cl. .......................... 257/530; 257/532; 438/467; 438/600; 438/622
[58] Field of Search ............................ 257/530, 532; 438/239, 467, 600, 622

[56] References Cited

U.S. PATENT DOCUMENTS

| | | | |
|---|---|---|---|
| 5,196,724 | 3/1993 | Gordon et al. | 257/530 |
| 5,208,177 | 5/1993 | Lee | 257/530 |
| 5,219,782 | 6/1993 | Liu et al. | 257/530 |
| 5,557,136 | 9/1996 | Gordon et al. | 257/530 |
| 5,592,016 | 1/1997 | Go et al. | 257/530 |

Primary Examiner—J. Carroll
Attorney, Agent, or Firm—Wells, St. John, Roberts, Gregory & Matkin, P.S.

[57] ABSTRACT

A method of jointly forming stacked capacitors and antifuses includes, a) providing a common layer of electrically conductive material to form both a capacitor storage node and an inner antifuse plate; b) providing a common layer of dielectric material over the capacitor storage node and the inner antifuse plate, the common layer of dielectric material comprising both an intervening capacitor dielectric element and an intervening antifuse dielectric element, the common layer of dielectric material having a first breakdown voltage per unit length value for a given current per unit area; c) providing a common layer of electrically conductive material over the common layer of dielectric material to form both a capacitor cell layer and an outer antifuse plate; d) providing a lateral edge of the outer antifuse plate and a lateral edge of the intervening antifuse dielectric element; and e) depositing an antifuse breakdown layer of dielectric material over the lateral edges of the outer antifuse plate and the intervening antifuse dielectric element, the antifuse breakdown layer having a second breakdown voltage per unit length value for the same given current per same unit area which is lower than said first breakdown voltage per unit length value. Novel antifuse constructions, integrated circuitry and method of blowing antifuses are also disclosed.

19 Claims, 6 Drawing Sheets

METHOD OF JOINTLY FORMING STACKED CAPACITORS AND ANTIFUSES, METHOD OF BLOWING ANTIFUSES, AND ANTIFUSES AND STACKED CAPACITORS CONSTITUTING A PART OF INTEGRATED CIRCUITRY

TECHNICAL FIELD

This invention relates to stacked capacitors and antifuses.

BACKGROUND OF THE INVENTION

In the manufacture of integrated circuitry, redundant circuit elements are typically provided in the event not all of the circuitry or components prove operable upon testing. Thus if some portion of the circuitry is inoperable, backup circuitry is available such that the chip is saleable. One manner of providing for such circuit redundancy provides antifuses and redundant circuit logic for activating such antifuses. An antifuse is a component which upon activation or "blowing" creates a short between two conductive elements.

Figure 1A:
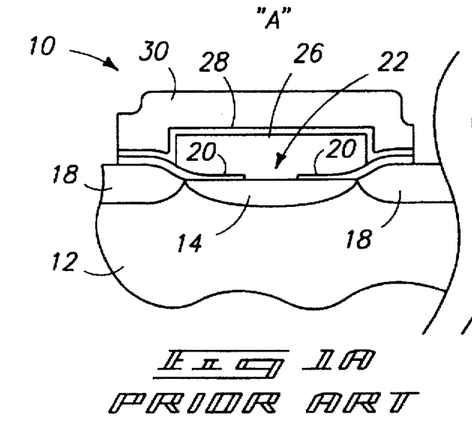
FIG. 1 is a diagrammatic sectional view of a prior art wafer fragment, and is discussed in the "Background" section above.
Figure 1B:
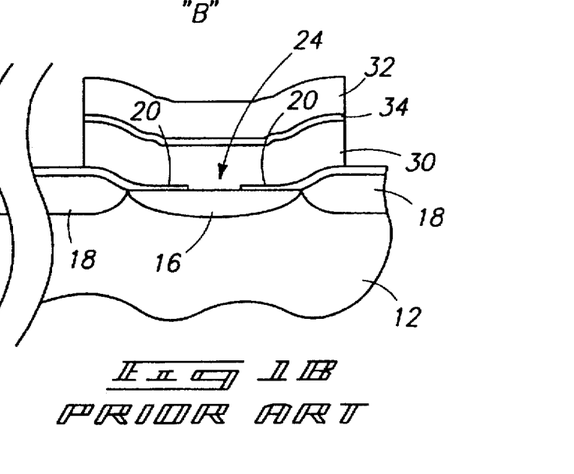

Antifuses are similar in construction to capacitors, as evidenced by FIG. 1. There illustrated are portions of a semiconductor wafer 10 in process. The left or "A" portion of the FIG. 1 illustrates a capacitor construction, whereas the right or "B" portion illustrates an antifuse. More specifically, wafer fragment 10 is comprised of a bulk substrate 12, diffusion regions 14 and 16 and field oxide regions 18. An insulator layer 20 is provided over substrate 12, with contacts 22 and 24 being provided therethrough to diffusion regions 14 and 16, respectively. Referring specifically to the capacitor construction of the "A" portion, such is comprised of a patterned electrically conductive storage node 26, an intervening dielectric layer 28, and an overlying capacitor cell layer 30. Referring to the antifuse "B" side of FIG. 1, such is comprised of a lower conductive inner antifuse plate 30 and an outer antifuse plate 32. These are separated and electrically isolated from one another by an intervening antifuse dielectric element 34. Accordingly, a capacitor and antifuse are similar to one another in that two conductive elements are separated by dielectric material.

To "blow" the antifuse, a certain level of quanta of charge ($Q_{BD}$) is passed through fuse dielectric 34 to cause a physical breakdown of intervening dielectric element 34. Such creates permanent electrically conductive paths between elements 32 and 30, thus forming a desired electrically conductive short.

It is desirable for antifuses to be able to be blow with short current pulses to speed programming. Such would be facilitated by high voltages. However, the maximum voltage to blow antifuses is limited by the diode and gate breakdown voltages of the periphery MOS circuitry. To speed programming for a fixed maximum voltage, it is desirable to have the fuses have a low $Q_{BD}$ and/or IV characteristics such that a high current level passes through the fuse for a given voltage. This can be accommodated by providing separate antifuse and capacitor constructions such that the material and/or thickness of the respective separating dielectric elements are optimized for desired capacitor or antifuse function. One significant drawback to this approach, however, is that considerably more processing steps are required than were it feasible to manufacture capacitors and antifuses during the same essential processing steps.

Accordingly, it would be desirable to develop methods which enable stacked capacitors and antifuses to be jointly developed in semiconductor wafer processing, and as well as to provide alternate antifuse constructions.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a method of jointly forming stacked capacitors and antifuses comprises the following steps:

providing a common layer of electrically conductive material to form both a capacitor storage node and an inner antifuse plate;

providing a common layer of dielectric material over the capacitor storage node and the inner antifuse plate, the common layer of dielectric material comprising both an intervening capacitor dielectric element and an intervening antifuse dielectric element, the common layer of dielectric material having a first breakdown voltage per unit length value for a given current per unit area;

providing a common layer of electrically conductive material over the common layer of dielectric material to form both a capacitor cell layer and an outer antifuse plate;

providing a lateral edge of the outer antifuse plate and a lateral edge of the intervening antifuse dielectric element; and depositing an antifuse breakdown layer of dielectric material over the lateral edges of the outer antifuse plate and the intervening antifuse dielectric element, the antifuse breakdown layer having a second breakdown voltage per unit length value for the same given current per same unit area which is lower than said first breakdown voltage per unit length value.

Other aspects of the invention, including antifuse constructions, integrated circuitry containing both antifuses and capacitors, and methods of blowing antifuses, will be appreciated from the following discussion and concluding claims.

More specifically and first with reference to FIGS. 2–5, a semiconductor wafer fragment processed in accordance with the invention is indicated generally by reference numeral 40. Such is comprised of a bulk substrate region 41, field oxide regions 42, and diffusion regions 43. Buried contact openings 44 are provided to diffusion regions 43. A common layer 46 of electrically conductive material is provided and patterned to form both a capacitor storage node 48 and an inner antifuse plate 50. An example thickness for layer 46 is from about 1,000 Angstroms to about 3,000 Angstroms, with a preferred material being conductively doped polysilicon.

Figures 2A, 2B:
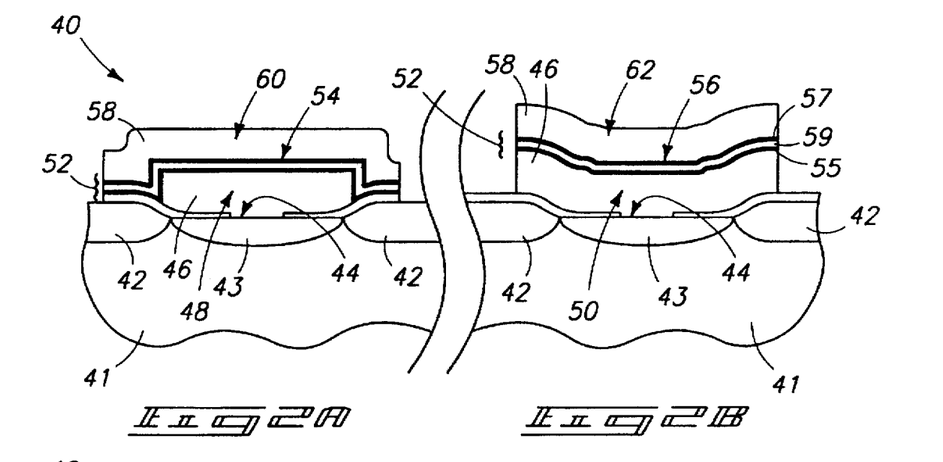
FIG. 2 is a diagrammatic sectional view of a wafer fragment at one processing step in accordance with the invention.
Figures 3A, 3B:
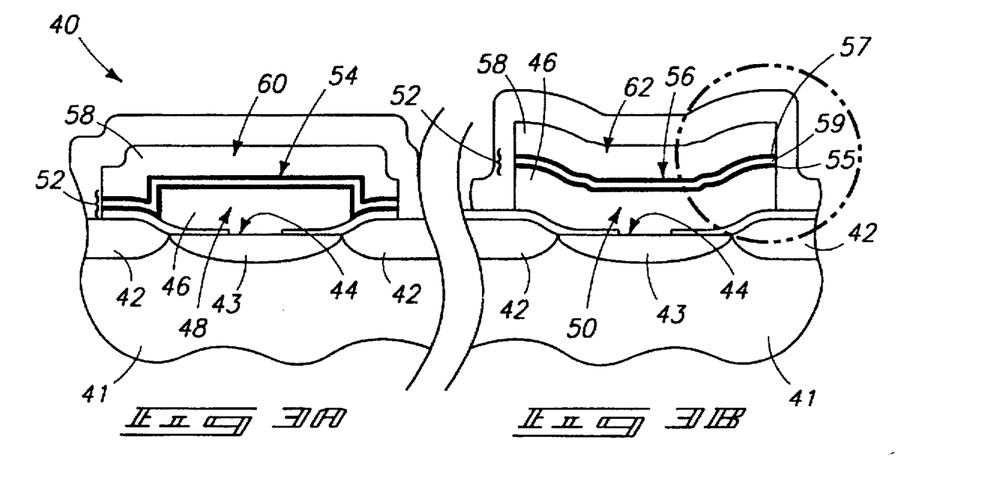
FIG. 3 is a view of the FIG. 2 wafer fragment taken at a processing step subsequent to that shown by FIG. 2.

A combination common layer 52 of dielectric material is provided over capacitor storage node 48 and inner antifuse plate 50 to define both an intervening capacitor dielectric element 54 and an intervening antifuse dielectric element 56. An example and preferred composition for layer 52 is the illustrated $SiO_2$ layer 55, $Si_3N_4$ layer 59, $SiO_2$ layer 57, thus forming a conventional and preferred capacitor dielectric element in the form of an oxide-nitride-oxide (ONO) composite. An example preferred thickness for layer 52 is 90 Angstroms, with the respective thickness for layers 55, 59 and 57 being 10, 70 and 10, respectively. For purposes of the continuing discussion, layer 52 and correspondingly elements 54 and 56 have a first breakdown voltage per unit length (alternately considered as per thickness) value for a given current per unit area. For example, the breakdown value for the above-described preferred embodiment combination layer 52 would be 10 megavolts per centimeter for a nanoamp per square micron.

A common layer 58 of electrically conductive material is provided over combination common layer 52 to form both a capacitor cell layer 60 and an outer antifuse plate 62. Thus, antifuse dielectric element 56 separates and electrically isolates the inner and outer antifuse plates from one another, while capacitor dielectric element 54 provides a desired capacitor dielectric function. An example and preferred thickness for layer 58 is from about 1,000 Angstroms to about 2,000 Angstroms, with an example preferred material being conductively doped polysilicon. Also apparent in the preferred embodiment, intervening capacitor dielectric element 54 consists of the material of intervening antifuse dielectric element 56, with each having the same thickness.

Figure 4:
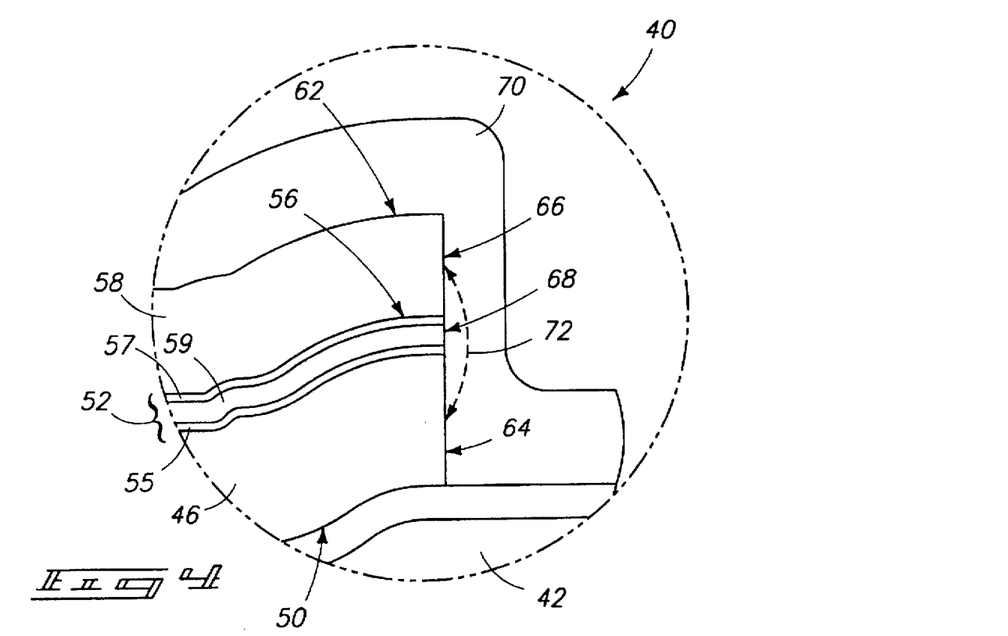
FIG. 4 is an enlarged view of a portion of the FIG. 3 wafer fragment.

Referring to FIG. 4, outer antifuse plate 62 and inner antifuse plate 50 have lateral edges 64 and 66, respectively. Likewise, common layer 52 of dielectric material of antifuse dielectric element 56 can be considered as having a common lateral edge 68. An antifuse breakdown layer 70 of dielectric material is deposited over lateral edges 64, 66, and 68 to both cover and contact such lateral edges. Antifuse breakdown layer 70 has a second breakdown voltage per unit length value for the same given current per same unit area which is lower than said first breakdown voltage per unit length value of layer 52. An example and preferred material for layer 70 is $SiO_2$ deposited by decomposition of tetraethylorthosilicate (TEOS), and deposited to a thickness of between about 100 and 1000 Angstroms. The breakdown value for such $SiO_2$ is 4–5 megavolts per centimeter for a nanoamp per square micron. Layer 70 might also comprise a global and thicker insulating layer for insulating and protecting the capacitors and antifuses.

Antifuse breakdown layer 70 defines a blowable edge path 72 extending from inner antifuse lateral edge 64 to outer antifuse lateral edge 66 which, upon application of an effective voltage for a given time, will conductively short the inner and outer antifuse plates together through such edge path 72. Specifically with reference to FIG. 5, timed application of an effective voltage will breakdown the $SiO_2$ of layer 70, thus forming a permanently electrically conductive path 72 which electrically shorts antifuse plate 62 and antifuse plate 50 together. Thus, the invention enables utilizing the same three essential layers in jointly forming capacitors and antifuses, the three layers being two conductive layers and a separate intervening dielectric layer. Antifuse operability (i.e., blowability) is provided through edge interconnecting dielectric material for the antifuse plates which has a breakdown value which is lower than that of the intervening antifuse dielectric element.

Figure 5:
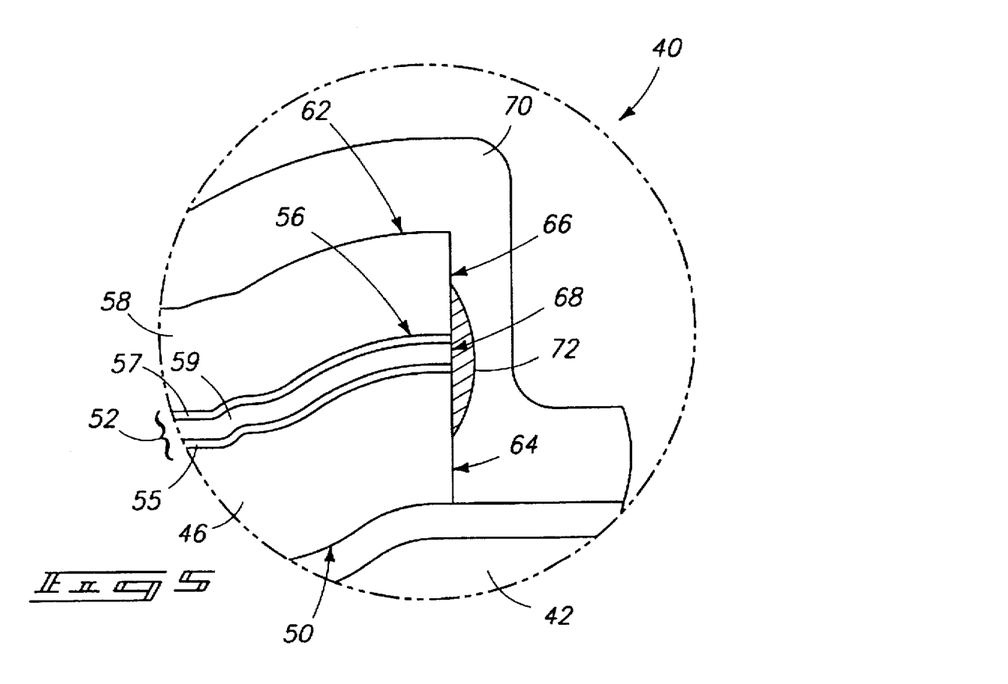
FIG. 5 is a view of the FIG. 2 wafer fragment as shown in FIG. 4, but shown at a processing step subsequent to that shown by FIG. 4.

An example voltage differential applied across the inner and outer antifuse plates effective to form conductive path 72, where element 50 has a thickness of 1000 Angstroms, element 62 has a thickness of 1000 Angstroms, and element 56 has an overall thickness of 90 Angstroms, is 9 volts for 1 microsecond.

Figure 6:
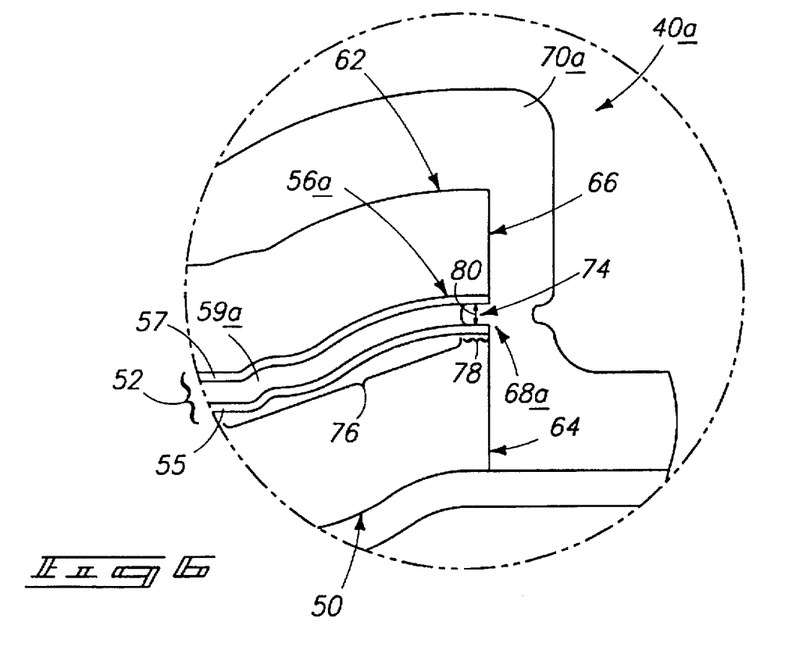
FIG. 6 is a view of an alternate embodiment wafer fragment corresponding in size and processing sequence to FIG. 4.

Alternate methods and constructions are also contemplated, with the invention only being limited by the concluding claims appropriately interpreted in accordance with the Doctrine of Equivalents. By way of example only, such example constructions are shown and described with reference to FIGS. 6–12. Like numbers are utilized in such figures, with letter suffixes being utilized where construction differs. Referring first to wafer fragment 40a of FIGS. 6 and 7, the exposed lateral edge of intervening antifuse dielectric element 56a has been etched into to form a void between inner and outer antifuse plates 50 and 62, respectively. More specifically and preferably as shown, such etching is conducted only into nitride layer 59a of the ONO composite layer, thus forming a void 74. An example etch chemistry for etching nitride layer 59a selectively relative to polysilicon and oxide would be heated phosphoric acid. Antifuse breakdown layer 70a is deposited to fill within void 74 between inner and outer antifuse plates 50, 62, respectively. Thus, intervening antifuse dielectric element 56a is comprised of a first region 76 and a second region 78. First lateral region 76 has a breakdown value for a given current per unit area which is higher than the breakdown value of second lateral region 78 due to lower breakdown material being present within void 74. Thus, antifuse breakdown layer material 70a comprises at least part of the material of second lateral region 78 of intervening dielectric element 56a. Second lateral region 78 thus defines a blowable path 80 which, upon application of an effective voltage over a suitable time period, will conductively short the inner and the outer antifuse plates together through the second lateral region.

Figure 7:
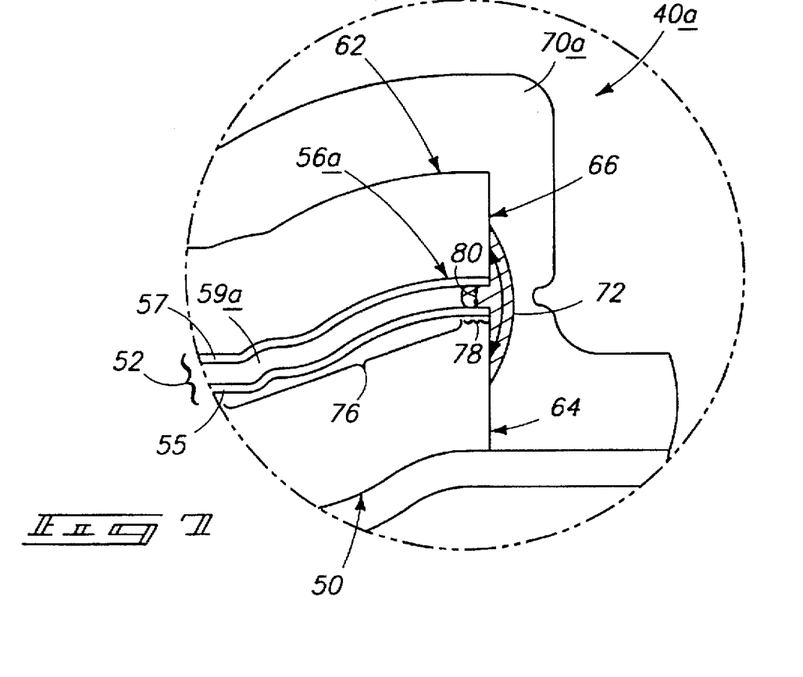
FIG. 7 is a view of the FIG. 6 wafer fragment shown at a processing step subsequent to that shown by FIG. 6.

Referring more specifically to FIG. 7, an effective voltage differential provided across inner antifuse plate 50 and outer antifuse plate 62 will permanently transform the material of layer 70a to form conductive shorting path 80 through second lateral region 78, thus blowing the antifuse. Likewise and most preferably, the differential voltage is preferably great enough to provide permanent conduction through edge path 72. Utilizing the above materials and dimensions, an example anticipated effective voltage to produce conductive paths 80 and 72 as shown in FIG. 7 would be 9–10 volts at a pulse width of 1 microsecond or less.

Figure 8:
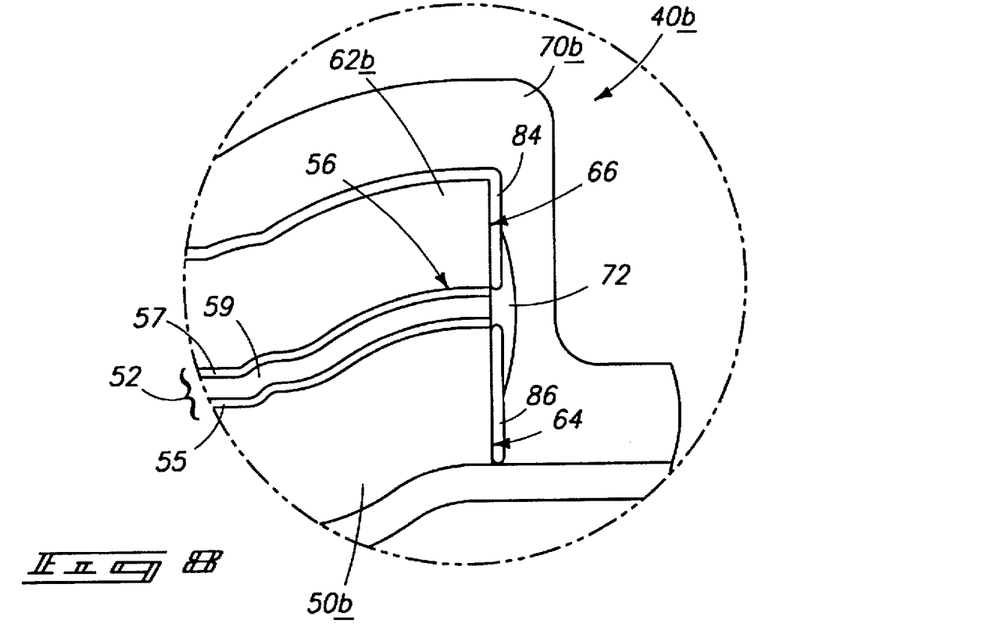
FIG. 8 is a diagrammatic sectional view of yet another alternate wafer fragment processed in accordance with the invention, and corresponds in size and processing sequence to FIG. 5.

FIG. 8 illustrates another alternate embodiment wafer fragment 40b. In this embodiment, oxide layers 84 and 86 are grown over antifuse plates 62b and 50b prior to deposition of antifuse breakdown layer 70b. Thus, oxide layers 84 and 86 are provided intermediate the antifuse breakdown layer and antifuse plates. The thickness of layers 84 and 86 is chosen to increase the edge breakdown value for a given current per unit area through layer 70b above some level, but still to provide a lower breakdown value than for the capacitor for optimizing programming of the antifuses.

Figure 9:
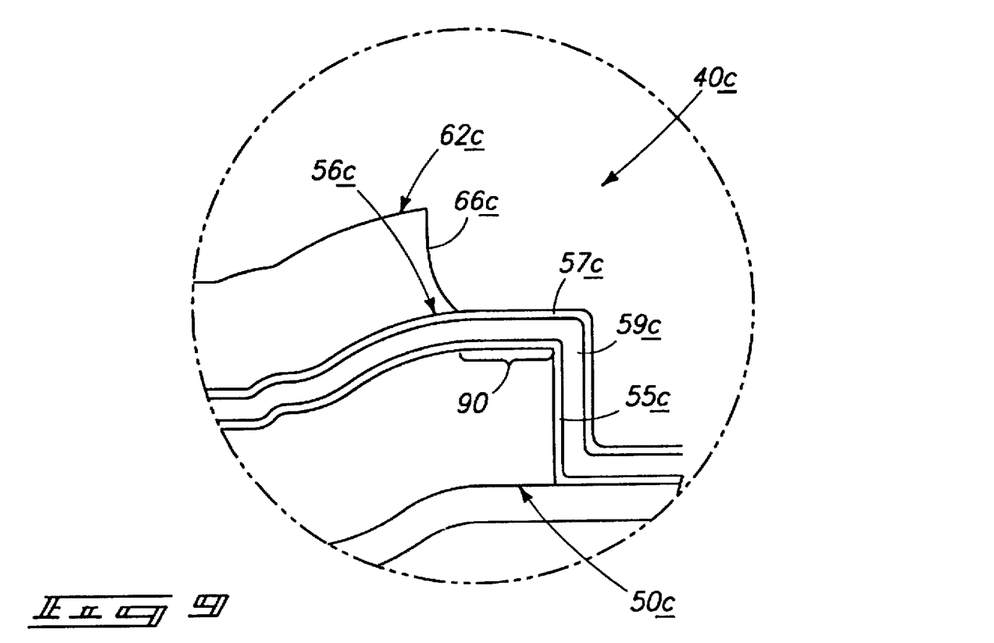
FIG. 9 is a diagrammatic section view of still another alternate wafer fragment processed in accordance with the invention.

Another embodiment is described with reference to FIGS. 9–12. Referring first to FIG. 9, a wafer fragment 40c is shown whereby outer antifuse plate 62c has been patterned relative to the illustrated underlying layers. Thus, inner antifuse plate 50c is provided with a lateral extension 90 which extends laterally outward beyond outer antifuse plate lateral edge 66c. Layers 57c, 59c and 55c have yet to be patterned.

Figure 10:
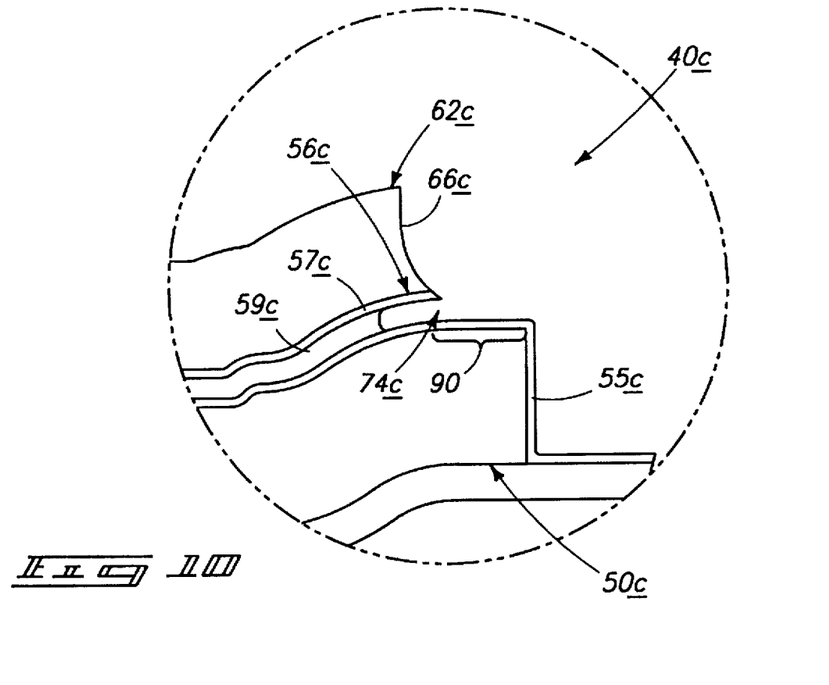
FIG. 10 is a view of the FIG. 9 wafer fragment shown at a processing step subsequent to that shown by FIG. 9.

Referring to FIG. 10, layers 57c and 59c are etched to produce undercut void 74c.

Figure 11:
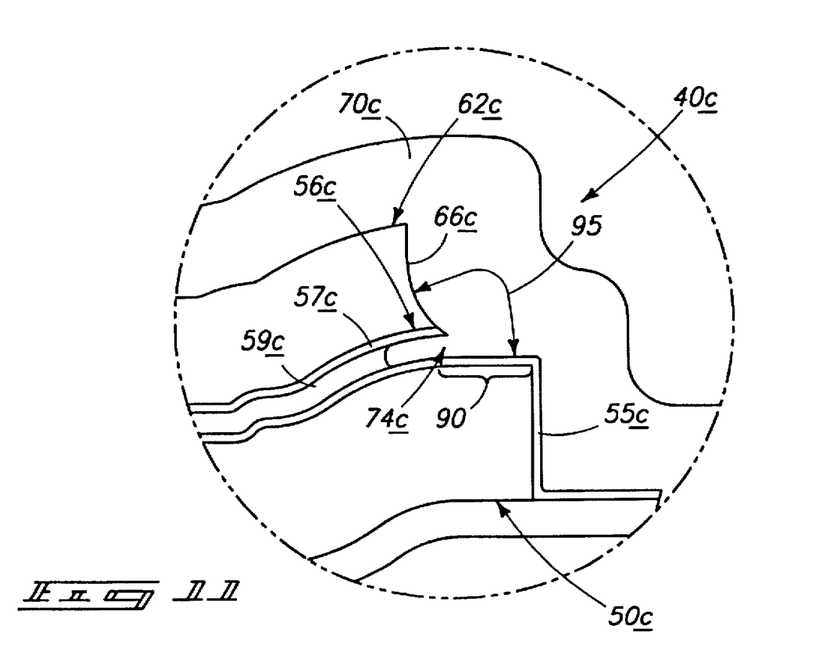
FIG. 11 is a view of the FIG. 9 wafer fragment shown at a processing step subsequent to that shown by FIG. 10.
Figure 12:
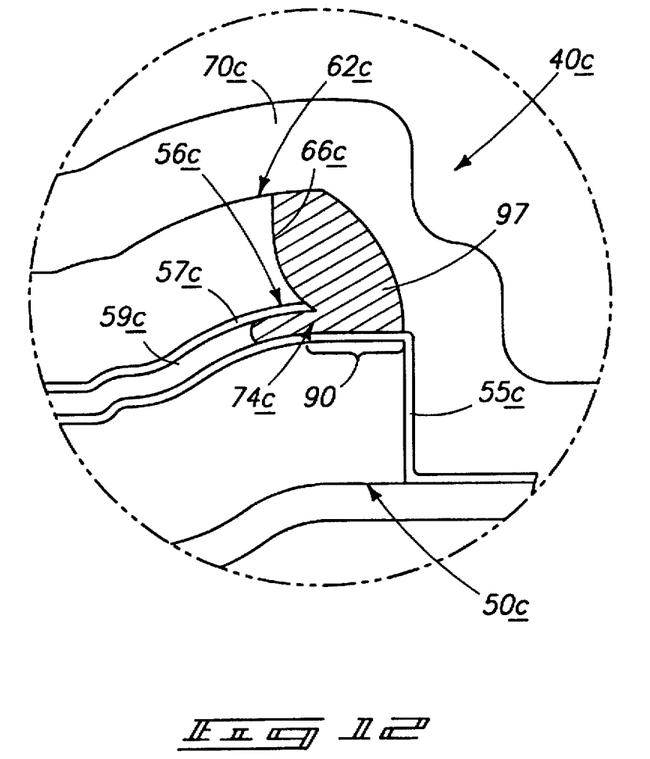
FIG. 12 is a view of the FIG. 9 wafer fragment shown at a processing step subsequent to that shown by FIG. 11.

Referring to FIG. 11, antifuse breakdown layer 70c is deposited to cover lateral edge 66c of outer antifuse plate 62c, and to also cover lateral extension 90 of inner antifuse plate 55c. Thus, a blowable path 95 is defined which extends between inner antifuse lateral extension portion 90 to outer antifuse lateral edge 66c. Upon application of an effective voltage at a suitable pulse width, path 95 will conductively short the inner and outer antifuse plates together through layer 70c along path 95. Such will form the FIG. 12 conductive region 97.

One object of the invention is to enable the use of lower effective antifuse programming voltages at short pulse widths, such as at 7–8 volts for 1 microsecond or less time.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. An antifuse comprising:

an inner antifuse plate having an upper surface and a lateral edge joined therewith;

an outer antifuse plate having a lateral edge; and an intervening antifuse dielectric element separating and electrically isolating the inner and outer antifuse plates from one another, the intervening antifuse dielectric element having first and second regions laterally spaced relative to one another, at least a portion of the intervening antifuse dielectric element being disposed over the entire inner antifuse plate upper surface, the first lateral region having a first breakdown voltage per unit length value for a given current per unit area, the second lateral region having a second breakdown voltage per unit length value for the same given current per same unit area which is lower than said first breakdown voltage per unit length value, the second lateral region defining a blowable path which upon application of an effective voltage will conductively short the inner and the outer antifuse plates together through the path but not through the first lateral region, wherein the first lateral region comprises an oxide-nitride-oxide composite, the dielectric material of the second lateral region comprising $SiO_2$ deposited by decomposition of TEOS.

2. An antifuse comprising:

an inner antifuse plate having a lateral edge;

an outer antifuse plate having a lateral edge;

an intervening antifuse dielectric element separating and electrically isolating the inner and outer antifuse plates from one another, the intervening antifuse dielectric element having a first breakdown voltage per unit length value for a given current per unit area; and the lateral edges of the inner and outer antifuse plates being covered by an antifuse breakdown layer of dielectric material, the antifuse breakdown layer having a second breakdown voltage per unit length value for the same given current per same unit area which is lower than said first breakdown voltage per unit length value, the antifuse breakdown layer defining a blowable edge path extending from the inner antifuse lateral edge to the outer antifuse lateral edge which upon application of an effective voltage will conductively short the inner and the outer antifuse plates together through the edge path.

3. The antifuse of claim 2 wherein the intervening antifuse dielectric element comprises an oxide-nitride-oxide composite, the dielectric material of the antifuse breakdown layer comprising $SiO_2$ deposited by decomposition of TEOS.

4. The antifuse of claim 2 wherein the antifuse breakdown layer contacts as well as covers the inner and outer antifuse plate lateral edges.

5. The antifuse of claim 2 further comprising an oxide layer over the outer antifuse plate lateral edge and an oxide layer over the inner antifuse plate lateral edge intermediate the antifuse breakdown layer.

6. An antifuse comprising:

an inner antifuse plate having an upper surface and a lateral edge joined therewith;

an outer antifuse plate having a lateral edge; and an intervening antifuse dielectric element separating and electrically isolating the inner and outer antifuse plates from one another, the intervening antifuse dielectric element having first and second regions laterally spaced relative to one another, at least a portion of the intervening antifuse dielectric element being disposed over the entire inner antifuse plate upper surface, the first lateral region having a first breakdown voltage per unit length value for a given current per unit area, the second lateral region having a second breakdown voltage per unit length value for the same given current per same unit area which is lower than said first breakdown voltage per unit length value, the second lateral region defining a blowable path which upon application of an effective voltage will conductively short the inner and the outer antifuse plates together through the path but not through the first lateral region, wherein the inner and the outer antifuse plates have lateral edges, the lateral edges being covered and contacted with an antifuse breakdown layer, the antifuse breakdown layer comprising material of the second lateral region of the intervening dielectric element.

7. The antifuse of claim 6 wherein the first lateral region comprises an oxide-nitride-oxide composite, the dielectric material of the second lateral region and antifuse breakdown layer comprising $SiO_2$ deposited by decomposition of TEOS.

8. An antifuse comprising:

an outer antifuse plate having a lateral edge;

an inner antifuse plate extending laterally outward beyond the outer antifuse plate lateral edge to define a lateral extension portion;

an intervening antifuse dielectric element separating and electrically isolating the inner and outer antifuse plates from one another, the intervening antifuse dielectric element having a first breakdown voltage per unit length value for a given current per unit area; and the lateral edge of the outer antifuse plate being covered by an antifuse breakdown layer of dielectric material which also covers the inner antifuse plate lateral extension portion, the antifuse breakdown layer having a second breakdown voltage per unit length value for the same given current per same unit area which is lower than said first breakdown voltage per unit length value, the antifuse breakdown layer defining a blowable path extending from the inner antifuse lateral extension portion to the outer anti fuse lateral edge which upon application of an effective voltage will conductively short the inner and the outer antifuse plates together through the path.

9. The antifuse of claim 8 wherein the intervening antifuse dielectric element comprises an oxide-nitride-oxide composite, the dielectric material of the antifuse breakdown layer comprising $SiO_2$ deposited by decomposition of TEOS.

10. The antifuse of claim 8 wherein the intervening antifuse dielectric element has first and second regions laterally spaced relative to one another, the second region comprising material of the antifuse breakdown layer.

11. Antifuses and stacked capacitors constituting a part of integrated circuitry comprising:

a series of antifuses respectively comprising:

an inner antifuse plate comprising a first conductive layer and having a lateral edge;

an outer antifuse plate comprising a second conductive layer and having a lateral edge; and an intervening antifuse dielectric element separating and electrically isolating the inner and outer antifuse plates from one another, the intervening dielectric element being comprised of an intervening dielectric layer and having a thickness, the intervening antifuse dielectric element having a first breakdown voltage per unit length value for a given current per unit area; and a series of capacitors respectively comprising:

a capacitor storage node comprised of the first conductive layer;

a capacitor cell layer comprised of the second conductive layer; and an intervening capacitor dielectric element separating the storage node and cell layer from one another, the intervening capacitor dielectric element being comprised of the intervening dielectric layer and having a thickness which is substantially the same as the antifuse dielectric element thickness;

the series of antifuses further respectively comprising:

an antifuse breakdown layer of dielectric material covering the lateral edges of the inner and outer antifuse plates, the antifuse breakdown layer having a second breakdown voltage per unit length value for the same given current per same unit area which is lower than said first breakdown voltage per unit length value, the antifuse breakdown layer defining a blowable edge path extending from the inner antifuse lateral edge to the outer antifuse lateral edge which upon application of an effective voltage will conductively short the inner and the outer antifuse plates together through the edge path.

12. The antifuse of claim 11 wherein the intervening capacitor dielectric element consists essentially of material of the intervening dielectric layer.

13. The antifuse of claim 11 wherein the intervening capacitor dielectric element consists of material of the intervening dielectric layer.

14. The antifuses and stacked capacitors of claim 11 wherein the intervening antifuse dielectric element and the intervening capacitor dielectric element each comprise an oxide-nitride-oxide composite, the dielectric material of the antifuse breakdown layer comprising $SiO_2$ deposited by decomposition of TEOS.

15. The antifuses and stacked capacitors of claim 11 wherein the intervening antifuse dielectric element and the intervening capacitor dielectric element each consist essentially of an oxide-nitride-oxide composite, the dielectric material of the antifuse breakdown layer comprising $SiO_2$ deposited by decomposition of TEOS.

16. The antifuses and stacked capacitors of claim 11 wherein the intervening antifuse dielectric element and the intervening capacitor dielectric element each consist of an oxide-nitride-oxide composite, the dielectric material of the antifuse breakdown layer comprising $SiO_2$ deposited by decomposition of TEOS.

17. A method of blowing an antifuse comprising the following steps:

providing an antifuse having an inner antifuse plate and an outer antifuse plate separated by an intervening antifuse dielectric element, the intervening antifuse dielectric element having a first breakdown voltage per unit length value for a given current per unit area, the inner and the outer antifuse plates having lateral edges, the lateral edges being covered by an antifuse breakdown layer of dielectric material, the antifuse breakdown layer having a second breakdown voltage per unit length value for the same given current per same unit area which is lower than said first breakdown voltage per unit length value; and providing a voltage differential across the inner and outer antifuse plates effective to form a conductive path between and through the inner and outer antifuse plates through the edge antifuse breakdown layer, thereby blowing the antifuse.

18. The method of blowing an antifuse of claim 17 wherein the lateral edges are contacted by the antifuse breakdown layer prior to the step of providing the voltage differential.

19. A method of blowing an antifuse comprising the following steps:

providing an antifuse having an inner antifuse plate and an outer antifuse plate separated by an intervening antifuse dielectric element which is formed atop a majority portion of the inner antifuse plate, the intervening antifuse dielectric element having first and second regions laterally spaced relative to one another, the first lateral region having a first breakdown voltage per unit length value for a given current per unit area, the second lateral region having a second breakdown voltage per unit length value for the same given current per same unit area which is lower than said first breakdown voltage per unit length value, the inner and the outer antifuse plates being provided with lateral edges, the lateral edges being covered and contacted with an antifuse breakdown layer, the antifuse breakdown layer comprising material of the second lateral region of the intervening dielectric element; and providing a voltage differential across the inner and outer antifuse plates effective to form a conductive path between the inner and outer antifuse plates through the second lateral region and also between and through the inner and outer antifuse plate edges through the edge antifuse breakdown layer, thereby blowing the antifuse.

* * * * *